United States Patent
Nakayama

(10) Patent No.: US 10,372,035 B2
(45) Date of Patent: Aug. 6, 2019

(54) IMPRINT APPARATUS, AND METHOD OF MANUFACTURING ARTICLE

(71) Applicant: CANON KABUSHIKI KAISHA, Tokyo (JP)

(72) Inventor: Takahiro Nakayama, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 2 days.

(21) Appl. No.: 15/471,043

(22) Filed: Mar. 28, 2017

(65) Prior Publication Data
US 2017/0285467 A1 Oct. 5, 2017

(30) Foreign Application Priority Data

Mar. 29, 2016 (JP) ................................ 2016-066315

(51) Int. Cl.
| | | |
|---|---|---|
| G03F 7/00 | (2006.01) | |
| B05D 3/06 | (2006.01) | |
| B05D 3/12 | (2006.01) | |
| H01L 21/00 | (2006.01) | |
| B05D 3/04 | (2006.01) | |
| B05D 1/42 | (2006.01) | |

(52) U.S. Cl.
CPC ............. *G03F 7/0002* (2013.01); *B05D 3/06* (2013.01); *B05D 3/12* (2013.01); *H01L 21/00* (2013.01); *B05D 1/42* (2013.01); *B05D 3/0466* (2013.01)

(58) Field of Classification Search
CPC ........... G03F 7/0002; B05D 3/06; B05D 3/12; B05D 1/42; B05D 3/0466; H01L 21/00
See application file for complete search history.

(56) References Cited

U.S. PATENT DOCUMENTS 8,226,392 B2 * 7/2012 Kawakami ............ B29C 43/003
425/135

FOREIGN PATENT DOCUMENTS

| JP | 2007098779 A | 4/2007 |
| JP | 5235506 B2 | 7/2013 |

* cited by examiner

*Primary Examiner* — Robert S Walters, Jr.
(74) *Attorney, Agent, or Firm* — Rossi, Kimms & McDowell LLP

(57) ABSTRACT

The present invention provides an imprint apparatus which forms a pattern of an imprint material on a substrate by using a mold, the apparatus comprising: a generator configured to generate ionized gas by ionizing a first gas; a supplier configured to supply a second gas including the ionized gas generated by the generator to a space under the mold; and a controller configured to control a flow rate of the second gas supplied by the supplier to the space, wherein the controller increases the flow rate of the second gas supplied from the supplier to the space so as to reduce a decrease in an ion concentration in the space caused by moving the substrate from the space after the mold is separated from the cured imprint material.

9 Claims, 7 Drawing Sheets

IMPRINT APPARATUS, AND METHOD OF MANUFACTURING ARTICLE

BACKGROUND OF THE INVENTION

Field of the Invention

The present invention relates to an imprint apparatus, and a method of manufacturing an article.

Description of the Related Art

An imprint apparatus which forms a pattern of an imprint material on a substrate by using a mold having a pattern with concave and convex portions has received attention as one type of lithography apparatus for mass-producing semiconductor devices, and the like. The imprint apparatus can form the pattern in the imprint material on the substrate by curing the imprint material on the substrate in a state in which the mold and the imprint material are in contact with each other and separating the mold from the cured imprint material.

In the imprint apparatus, a phenomenon occurs in which the mold and the cured imprint material become charged by separating the mold from the imprint material. If such a phenomenon occurs, peripheral particles may be attracted and adhere to the mold. Then, if the mold and the imprint material on the substrate are brought into contact with each other in a state in which the particles adhere to the mold, a defect may be generated in the pattern formed in the imprint material by using the mold, or the mold may be damaged. Japanese Patent Laid-Open No. 2007-98779 and Japanese Patent No. 5235506 propose a method of removing electric-charge of a mold and an imprint material on a substrate by supplying an ionized gas between the mold and the substrate.

After separating the mold from the cured imprint material, the imprint apparatus moves the substrate (substrate stage) from a space under the mold in order to supply the imprint material onto the substrate or change the substrate. At this time, by moving the substrate, ions may diffuse into a place where the substrate has existed, and an ion concentration in the space may decrease, making it difficult to remove electric-charge of the mold efficiently.

SUMMARY OF THE INVENTION

The present invention provides, for example, an imprint apparatus advantageous in removing electric-charge of a mold efficiently.

According to one aspect of the present invention, there is provided an imprint apparatus which forms a pattern of an imprint material on a substrate by using a mold, the apparatus comprising: a generator configured to generate ionized gas by ionizing a first gas; a supplier configured to supply a second gas including the ionized gas generated by the generator to a space under the mold; and a controller configured to control a flow rate of the second gas supplied by the supplier to the space, wherein the controller increases the flow rate of the second gas supplied from the supplier to the space so as to reduce a decrease in an ion concentration in the space caused by moving the substrate from the space after the mold is separated from the cured imprint material.

Further features of the present invention will become apparent from the following description of exemplary embodiments with reference to the attached drawings.

DESCRIPTION OF THE EMBODIMENTS

Figure 1:
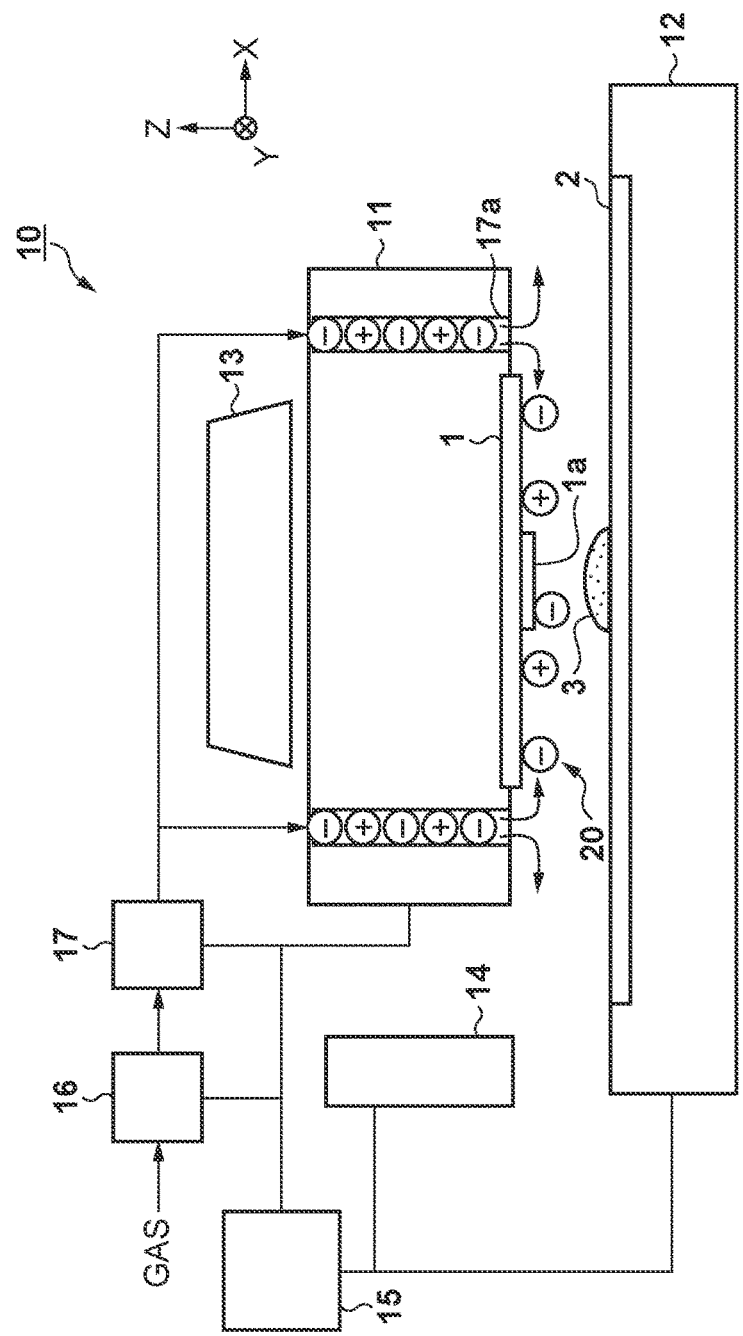
FIG. 1 is a schematic view showing the arrangement of an imprint apparatus.

Exemplary embodiments of the present invention will be described below with reference to the accompanying drawings. Note that the same reference numerals denote the same members throughout the drawings, and a repetitive description thereof will not be given. In a description below, two directions perpendicular to each other on a surface parallel to a substrate surface will be defined as an X direction and a Y direction, and a direction perpendicular to the substrate surface will be defined as a Z direction.

First, an imprint apparatus 10 will be described. The imprint apparatus 10 is used to manufacture a semiconductor device or the like and performs an imprint process of forming a pattern in an imprint material 3 on a substrate by using a mold 1 having a pattern with concave and convex portions 1a. For example, the imprint apparatus 10 cures the imprint material 3 on the substrate in a state in which the mold 1 and the imprint material 3 are in contact with each other. Then, the imprint apparatus 10 can form a pattern conforming to the pattern with concave and convex portions of the mold 1 in the imprint material 3 on the substrate by widening the spacing between the mold 1 and a substrate 2, and separating the mold 1 (releasing a mold) from the cured imprint material 3. That is, the imprint apparatus 10 is an apparatus which forms a pattern of a cured product, to which a pattern with concave and convex portions of a die has been transferred, by bringing the imprint material supplied onto the substrate into contact with the die and applying curing energy to the imprint material.

A method of curing the imprint material 3 includes a heat cycle method using heat and a photo-curing method using light. An example will be described below in which the photo-curing method is adopted. The photo-curing method is a method of curing the imprint material 3 by supplying an uncured ultraviolet-curing resin as the imprint material 3 onto the substrate, and irradiating the imprint material 3 with ultraviolet light in the state in which the mold 1 and the imprint material 3 are in contact with each other.

A curable composition (may also be referred to as an uncured resin) which is cured by receiving curing energy is used for the imprint material. An electromagnetic wave, heat, or the like is used as the curing energy. For example, light such as infrared light, visible rays, ultraviolet light, or the like whose wavelength is selected from a range of 10 nm (inclusive) to 1 mm (inclusive) is used as the electromagnetic wave.

The curable composition is a composition that is cured by light irradiation or application of heat. Out of these compositions, a photo-curable composition that is cured by light contains at least a polymerizable compound and a photopolymerization initiator, and may contain a non-polymerizable compound or solvent as needed. The non-polymerizable compound is at least a material selected from the group consisting of a sensitizer, a hydrogen donor, an internal mold release agent, a surfactant, an antioxidant, a polymer component, and the like.

The imprint material is applied on the substrate in a film-like shape by a spin coater or a slit coater. Alternatively, a liquid injection head may apply, on the substrate, the imprint material having a droplet-like shape, or an island-like shape or a film-like shape formed by a plurality of droplets connected to each other. The viscosity (viscosity at 25° C.) of the imprint material is set at, for example, 1 mPa·s (inclusive) to 100 mPa·s (inclusive).

FIG. 1 is a schematic view showing the arrangement of the imprint apparatus 10. The imprint apparatus 10 can include, for example, an imprint head (a holder), a substrate stage 12, a curing unit 13, a discharge unit 14, and a controller 15 (a control unit). The controller 15 includes, for example, a CPU, a memory, and the like and controls the imprint process (controls the respective units of the imprint apparatus 10).

The mold 1 is generally made of a material, such as quartz, capable of transmitting ultraviolet light, and the pattern with concave and convex portions 1a for molding the imprint material 3 on the substrate is formed in a portion (mesa portion) on its substrate-side surface. Glass, a ceramic, a metal, a semiconductor, a resin, or the like is used for the substrate 2, and a member made of a material different from that of the substrate may be formed on its surface as needed. More specifically, a silicon wafer, a compound semiconductor wafer, silica glass, or the like is used as the substrate 2. The discharge unit 14 supplies the imprint material 3 (resin) onto the upper surface (surface to be processed) of the substrate 2.

For example, the imprint head 11 holds the mold 1 by a vacuum chuck force, an electrostatic chuck force, or the like, and drives the mold 1 in the Z direction so as to change the spacing (the relative positions in the Z direction) between the mold 1 and the substrate 2. For example, the substrate stage 12 holds the substrate 2 by a vacuum chuck force, an electrostatic chuck force, or the like, and drives the substrate in the X and Y directions so as to change the relative positions of the mold 1 and the substrate 2 in the X and Y directions. In a description below, the imprint head 11 performs an operation of changing the relative positions of the mold 1 and the substrate 2 in the Z direction. However, the present invention is not limited to this. The substrate stage 12 may perform the operation, or both the imprint head 11 and the substrate stage 12 may relatively perform the operation. The substrate stage 12 performs an operation of changing the relative positions of the mold 1 and the substrate 2 in the X and Y directions. However, the present invention is not limited to this. The imprint head 11 may perform the operation, or both the substrate stage 12 and the imprint head 11 may relatively perform the operation.

The curing unit 13 irradiates the imprint material 3 on the substrate with light (ultraviolet light) which cures the imprint material 3 via the mold 1, curing the imprint material 3. The curing unit 13 can include, for example, a light source which emits the light which cures the imprint material 3 and an optical element for adjusting the light emitted from the light source to light suitable for the imprint process. The discharge unit 14 discharges the imprint material 3 in order to supply (dispense) the imprint material 3 onto the substrate.

Figure 2:
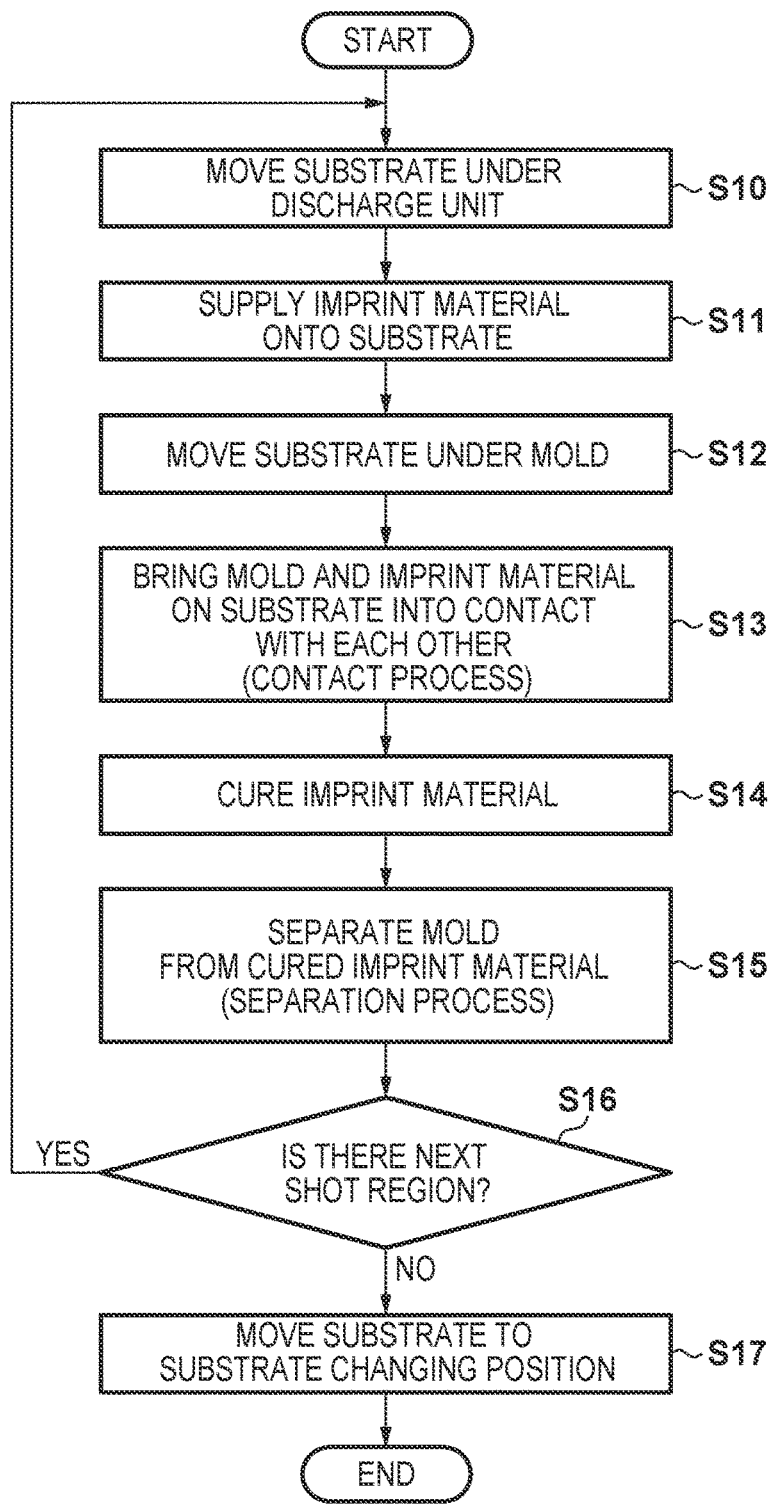
FIG. 2 is a flowchart showing the sequence of an imprint process.

The imprint process in the imprint apparatus 10 will now be described with reference to FIG. 2. FIG. 2 is a flowchart showing the sequence of the imprint process. The controller 15 can perform respective steps in the imprint process to be described below.

In step S10, the controller 15 moves the substrate stage 12 (substrate 2) so as to arrange the substrate 2 under the discharge unit 14. In step S11, the controller 15 controls the discharge unit 14 so as to supply the imprint material 3 to a shot region in which the imprint process is to be performed (target shot region) out of a plurality of shot regions formed on the substrate 2. In step S12, the controller 15 moves the substrate stage 12 (substrate 2) so as to arrange the substrate 2 (target shot region) under the mold 1.

In step S13, the controller 15 controls the imprint head 11 so as to narrow the spacing between the mold 1 and the substrate 2, bringing the mold 1 and the imprint material 3 on the substrate into contact with each other (contact process). In step S14, the controller 15 controls, in the state in which the mold 1 and the imprint material 3 on the substrate are in contact with each other, the curing unit 13 so as to irradiate the imprint material 3 with light, curing the imprint material 3. In step S15, the controller 15 controls the imprint head 11 so as to widen the spacing between the mold 1 and the substrate 2, separating the mold 1 from the cured imprint material 3 (separation process). This makes it possible to form a three-dimensional shape pattern conforming to the pattern with concave and convex portions of the mold 1 in the imprint material 3 on the target shot region.

In step S16, the controller 15 determines whether there is a shot region (next shot region) in which a pattern should continuously be formed on the substrate. If there is the next shot region, the process returns to step S10. If there is not the next shot region, the process advances to step S17. In step S17, the controller 15 moves the substrate stage 12 (substrate 2) so as to arrange the substrate 2 at a changing position where the substrate 2 is to be changed.

In the imprint apparatus 10, a phenomenon generally occurs in which the mold 1 and the cured imprint material 3 become charged by separating the mold from the imprint material 3. If such a phenomenon occurs, peripheral particles may be attracted and adhere to the mold 1. At this time, if the mold 1 and the imprint material 3 on the substrate are brought into contact with each other in a state in which the particles adhere to the mold 1, a defect may be generated in the pattern formed in the imprint material 3, or the mold 1 may be damaged. To cope with this, the imprint apparatus 10 can include an ion generator 16 (a generation unit) which generates an ionized gas by ionizing a first gas. A supplier 17 (a supply unit) which supplies (blows out) a gas (second gas) including the ionized gas generated by the ion generator 16 to a space 20 under the mold 1. Note that in the imprint apparatus 10, the supplier 17 supplies the gas including the ionized gas generated by the ion generator 16 to the space 20 under the mold 1 in the respective steps of the flowchart shown in FIG. 2 unless there are restrictions in embodiments to be described below.

Figure 3:
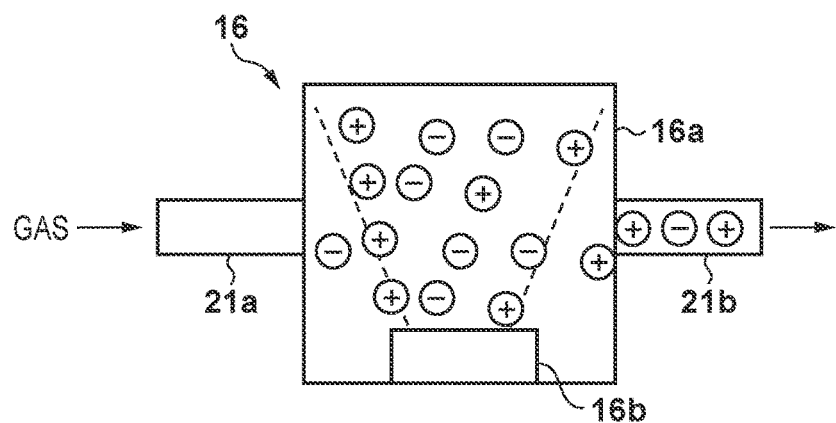
FIG. 3 is a schematic view showing the arrangement of an ion generator.

The arrangements of the ion generator 16 and the supplier 17 will now be described. As shown in FIG. 3, the ion generator 16 includes a chamber 16a connected to pipes (flow paths) 21a and 21b, and an emitting unit 16b which emits energy beams (for example, X-rays, soft X-rays, α-rays, or the like) into the chamber 16a. Then, the ion generator 16 irradiates the first gas supplied into the chamber 16a via the pipe 21a with the energy beams emitted from the emitting unit 16b to generate the ionized gas. The ionized gas is supplied to the supplier 17 via the pipe 21b.

Figure 4:
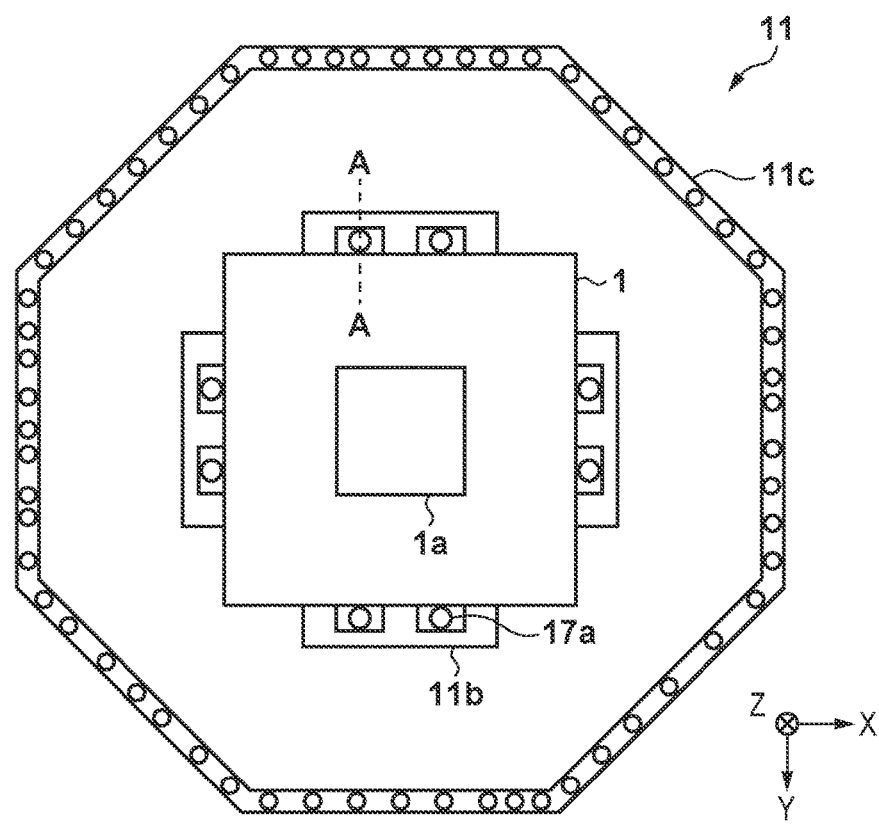
FIG. 4 is a view showing the positions of supply ports in an imprint head.
Figure 5:
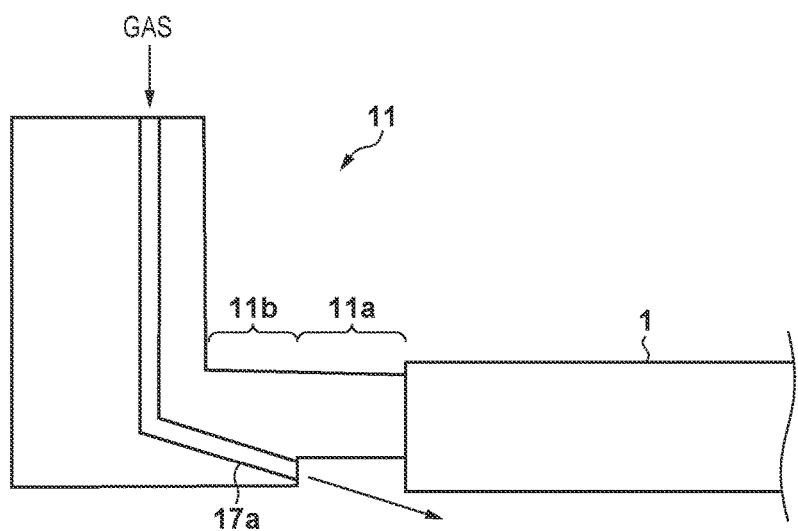
FIG. 5 is a view showing the position of the supply port in the imprint head.

The supplier 17 supplies the gas including the ionized gas generated by the ion generator 16 to the space 20 under the mold 1 via supply ports 17a provided in the imprint head 11. FIGS. 4 and 5 are views showing the positions of the supply ports 17a in the imprint head 11. FIG. 4 is the view showing the imprint head 11 viewed from the lower side (−Z direction). FIG. 5 is a sectional view (a sectional view taken along a line A-A in FIG. 4) showing the imprint head 11. As shown in FIGS. 4 and 5, the imprint head 11 can include holding portions 11a which hold the mold 1 and peripheral portions 11b around the holding portions 11a, and the supply ports 17a can be formed in the peripheral portions 11b. A blowout port 11c for blowing out, for example, clean dry air is provided in the imprint head 11 so as to form an air curtain which prevents the particles from entering the space 20 under the mold 1 from the outside of the space 20. The blowout port 11c may be provided outside the imprint head 11 and along the circumference of the imprint head 11. Unlike the supply ports 17a, the blowout port 11c preferably, for example, blows out a gas such as the clean dry air in the −Z direction.

Note that in the imprint apparatus 10, a bubble may remain in a concave portion of the pattern with concave and convex portions 1a of the mold 1 in the contact process of bringing the mold 1 and the substrate 2 into contact with each other. In this case, a problem (filling defect) may be caused in the pattern formed in the imprint material 3 on the substrate, making it difficult to form an accurate pattern in the imprint material 3. The bubble remaining in the pattern with concave and convex portions 1a of the mold 1 disappears as time goes by. However, much time may be required until then, decreasing throughput (productivity).

Therefore, in the imprint apparatus 10, a gas (third gas) for accelerating filling of the concave portion of the pattern with concave and convex portions 1a of the mold 1 with the imprint material 3 (to be referred to as a filling acceleration gas hereinafter) is preferably supplied between the mold 1 and the substrate 2 in the contact process. For example, a penetrating gas having high permeability with respect to the mold 1 and the substrate 2, a condensable gas which condenses due to an increase in a pressure when the mold 1 is pressed against the imprint material 3, or the like is used as the filling acceleration gas. For example, helium gas (He) can be used as the penetrating gas. For example, PFP (pentafluoropropane) can be used as the condensable gas. It is possible, by using the filling acceleration gas, to reduce a pattern defect which is caused by the gas generated in the contact process.

It is particularly preferable that both the ionized gas generated by the ion generator 16 (the gas supplied to the chamber 16a via the pipe 21a) and the filling acceleration gas are used. By using the filling acceleration gas as the gas supplied from the supplier 17 (supply ports 17a) to the space 20, it is possible to simplify the arrangement of the imprint apparatus 10 as compared with a case in which respective supplier each for supplying a gas are provided.

First Embodiment

Figure 6:
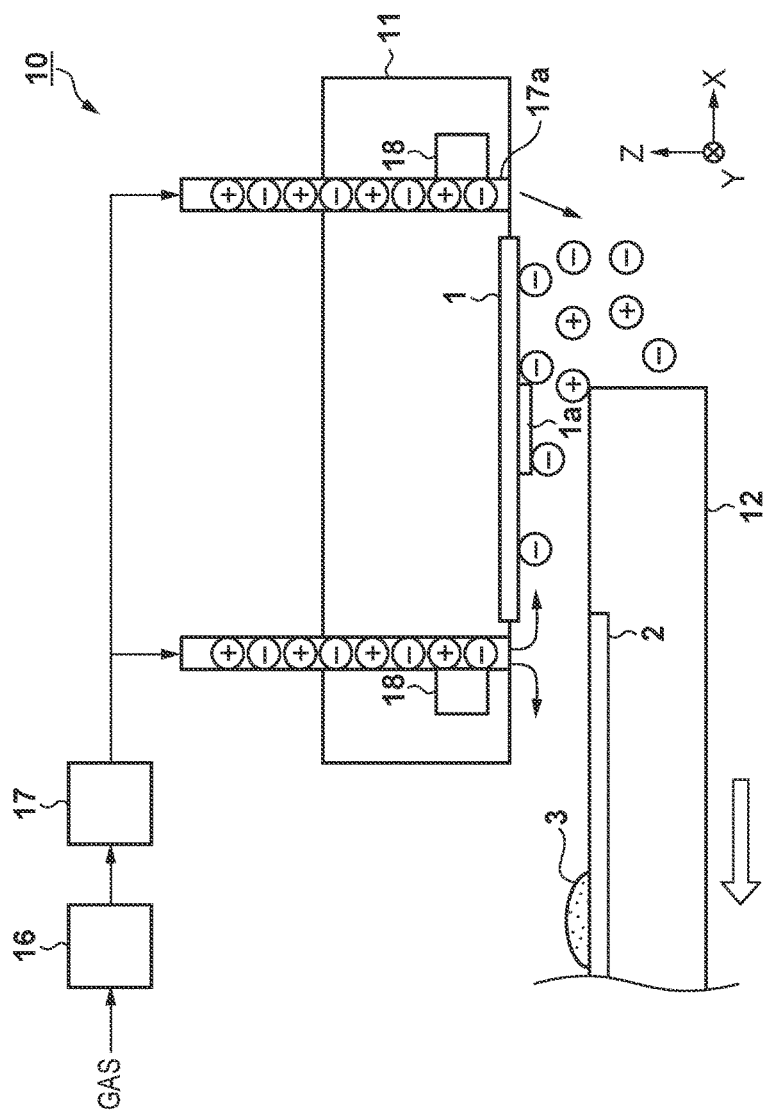
FIG. 6 is a view showing a state in which a substrate stage is moved.

In an imprint apparatus 10, a substrate 2 is moved from a space 20 under a mold 1 as shown in FIG. 6 in order to supply a cured imprint material 3 onto the substrate or change the substrate 2 after the mold 1 is separated from the imprint material 3 (after a separation process). At this time, by moving a substrate stage 12 (substrate 2), ions may diffuse into the space 20 where the substrate stage 12 (substrate 2) has existed, and an ion concentration in the space 20 may decrease, making it difficult to remove electric-charge of the mold 1 efficiently. That is, it may become difficult to maintain the amount of ions supplied to the mold per unit time and unit area. To cope with this, the imprint apparatus 10 of this embodiment increases the flow rate of a gas supplied from a supplier 17 to the space 20 under the mold 1 so as to reduce (suppress) a decrease in the ion concentration in the space 20 caused by moving the substrate 2 from the space 20 after the separation process.

A method of increasing the flow rate of a gas supplied from supply ports 17a to the space 20 under the mold 1 in a process of moving the substrate stage 12 from the space 20 will now be described. As one of the methods, there is a method of, for example, providing a detector 18 which detects the pressure of the gas supplied from the supply ports 17a(supplier 17) to the space 20 and increasing the flow rate of the gas supplied from the supply ports 17a to the space 20 in accordance with a detection result of the detector 18.

When the substrate stage 12 is arranged under the supply ports 17a, the substrate stage 12 disturbs (obstructs) gas supply from the supply ports 17a to the space 20. On the other hand, the gas is easily supplied from the supply ports 17a to the space 20 if the substrate stage 12 which disturbs gas supply moves under the supply ports 17a, decreasing the pressure of the gas supplied from the supply ports 17a to the space 20. That is, the pressure of the gas supplied from the supply ports 17a to the space 20 changes depending on whether or not the substrate stage 12 is arranged under the supply ports 17a. Therefore, a controller 15 preferably increases the flow rate of the gas supplied from the supply ports 17a to the space 20 in response to the fact that the detector 18 detects a decrease in pressure of the gas supplied from the supply ports 17a to the space 20. The increase amount of the gas supplied from the supplier 17 to the space 20 can be obtained by a simulation or calculation. In the simulation or the like, for example, the volume of the substrate stage 12, the volume of a space between the substrate stage 12 and the mold 1 in a state in which the substrate 2 and the mold 1 face each other, the ion concentration of the gas supplied from the supplier 17 to the space 20, or the like can be used. The increase amount may be obtained from an experiment conducted before the imprint process.

Note that based on the detection result of the detector 18, the controller 15 may control the flow rate of the gas supplied from the supplier 17 to the space 20 such that the pressure of the gas supplied form the supply ports 17a to the space falls within a predetermined range (for example, becomes constant). In this embodiment, the flow rate of the gas supplied from the supplier 17 to the space 20 is controlled. However, a pressure regulating valve may be provided in the supplier 17 to control, by the pressure regulating valve, the pressure of the gas supplied from the supplier 17 to the space 20. Further, the flow rate of the gas supplied from the supplier 17 to the space 20 may be increased in accordance with the position of the substrate stage 12 in the X and Y directions (the relative positions of the mold 1 and the substrate 2 in the X and Y directions).

As described above, the imprint apparatus 10 of this embodiment increases the flow rate of the gas supplied from the supplier 17 to the space 20 under the mold 1 so as to reduce the decrease in the ion concentration in the space 20 caused by moving the substrate 2 from the space 20. This makes it possible to supply ions to the mold 1 stably and to remove electric-charge of the mold 1 efficiently.

Note that in order to supply the ions to the mold 1 stably, the concentration of the ions supplied from the supply ports 17a may be made higher when the substrate 2 is away from an imprint position than when the substrate 2 is positioned at the imprint position. This process may be performed independently or as a gas flow rate increases. This also makes it possible to reduce the decrease in the ion concentration in the space 20 under the mold 1 caused by moving the substrate 2 from the space 20.

Second Embodiment

Performance in accelerating filling of a pattern with concave and convex portions 1a of a mold 1 with an imprint material of an ionized filling acceleration gas may be degraded as compared with that of an unionized filling acceleration gas. Therefore, in a contact process, if the ionized filling acceleration gas is used, a filling time of the pattern with concave and convex portions 1a of the mold 1 with an imprint material 3 may become longer than in a case in which the unionized filling acceleration gas is used, decreasing throughput. To cope with this, in the second embodiment, an imprint apparatus 10 includes an adjuster 19 (an adjustment unit) which adjusts the ion concentration of the filling acceleration gas supplied from a supplier 17 (supply ports 17a) to a space 20. Then, a controller 15 controls the adjuster 19 so as to make the ion concentration of the filling acceleration gas supplied from the supplier 17 to the space 20 in a contact process lower than that in a process different from the contact process. The "process different from the contact process" can include, for example, at least one step out of steps S10 to S12 and steps S14 to S17 of a flowchart shown in FIG. 2.

Figure 7:
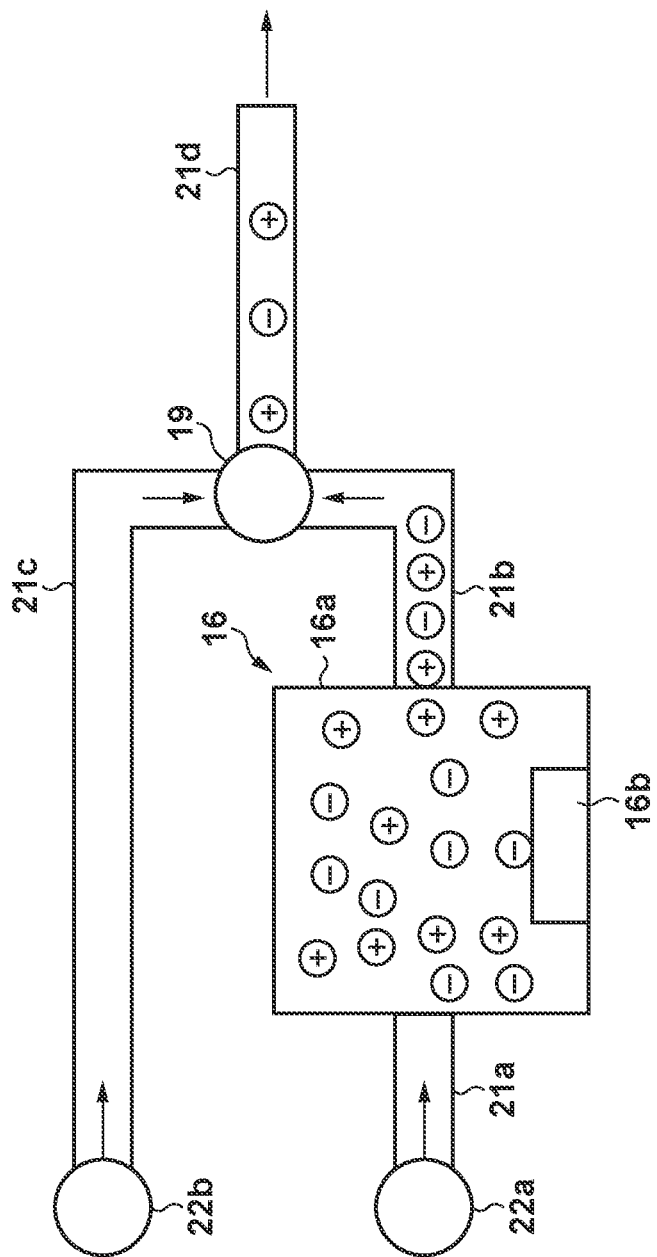
FIG. 7 is a view showing an example of the arrangement of an adjuster.

FIG. 7 is a view showing an example of the arrangement of the adjuster 19. The adjuster 19 of this embodiment changes the mixing ratio of a filling acceleration gas supplied with being ionized by an ion generator 16 and a filling acceleration gas supplied from a gas supply source without being ionized. By doing so, the ion concentration of the filling acceleration gas supplied from the supplier 17 to the space 20 is adjusted. For example, a pipe 21b and a pipe 21c are connected to the adjuster 19. A filling acceleration gas supplied from a gas supply source 22a to the ion generator 16 via a pipe 21a and ionized by the ion generator 16 is supplied from the pipe 21b. A filling acceleration gas from a gas supply source 22b is supplied from the pipe 21c without being ionized. Then, the adjuster 19 can include, for example, flow control valves (for example, mass flow controllers) provided for the pipes 21b and 21c, respectively, and can change the mixing ratio by controlling the flow control valves of the respective pipes. A filling acceleration gas whose ion concentration is adjusted by the adjuster 19 is supplied to the supplier 17 via a pipe 21d.

Note that the gas supply source 22a which supplies the filling acceleration gas to the pipe 21a and the gas supply source 22b which supplies the filling acceleration gas to the pipe 21c are provided separately in FIG. 7. However, the present invention is not limited to this. An arrangement is also possible in which the filling acceleration gas is supplied from a common (same) gas supply source to the pipe 21a and the pipe 21c.

An example will now be described in which the controller 15 controls the adjuster 19. The "mixing ratio" used in a description below is defined as the ratio of the flow rate of the ionized filling acceleration gas to the sum of the flow rate of the ionized filling acceleration gas and the flow rate of the unionized filling acceleration gas.

In steps S10 to S12 of the flowchart shown in FIG. 2, the controller 15 controls the adjuster 19 setting the mixing ratio as the first ratio. After the step S12 is terminated, the controller 15 changes the mixing ratio to the second ratio lower than the first ratio and controls the adjuster 19 setting the mixing ratio as the second ratio in step S13 (contact process). After step S13 is terminated, the controller 15 resets the mixing ratio to the first ratio and controls the adjuster 19 setting the mixing ratio as the first ratio in steps S14 to S17. It is possible, by thus controlling the adjuster 19, to make the ion concentration of the filling acceleration gas supplied from the supplier 17 to the space 20 in the contact process lower than in a process (step) different from the contact process. Note that, for example, the first ratio can be set to 100%, and the second ratio can be set to 0%. In this case, the adjuster 19 may be configured to adjust the ion concentration of the filling acceleration gas to another mixing ratio or adjust the mixing ratio by switching between the ionized filling acceleration gas and the unionized filling acceleration gas.

As described above, the imprint apparatus 10 of this embodiment makes the ion concentration of the gas supplied from the supplier 17 to the space 20 in the contact process lower than that in the process different from the contact process. This makes it possible to suppress degradation in the performance in accelerating filling of the pattern with concave and convex portions 1a of the mold 1 with the imprint material 3 and also to remove electric-charge of the mold 1 efficiently. Note that control according to the second embodiment may be performed together with control according to the first embodiment.

Third Embodiment

Figure 8:
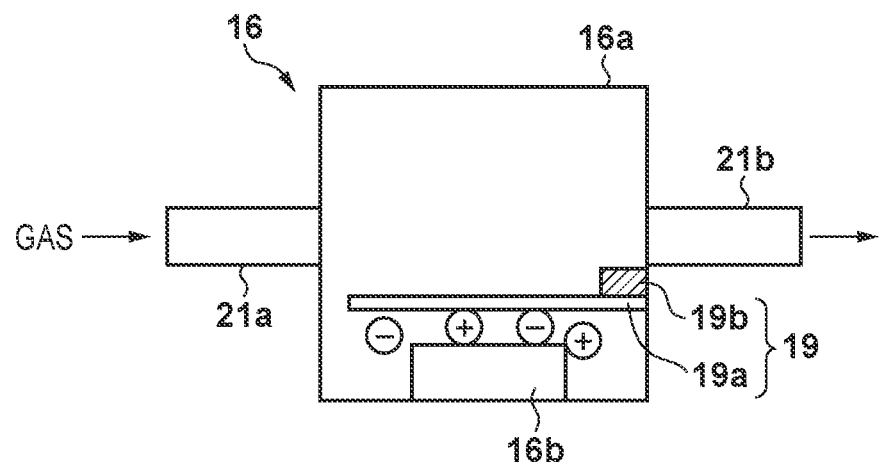
FIG. 8 is a view showing an example of the arrangement of an adjuster.

In the third embodiment, another example of the arrangement of an adjuster 19 will be described. FIG. 8 is a view showing the other example of the adjuster 19. The adjuster 19 of the third embodiment includes a plate 19a for blocking an energy beam emitted from an emitting unit 16b of an ion generator 16 and a driving unit 19b which drives the plate 19a. Then, the adjuster 19 controls the driving unit 19b so as to change the area of a portion of the plate 19a arranged in the optical path of the energy beam. This makes it possible to change the amount of ions generated by the ion generator 16 per unit time and adjust the concentration of ions supplied from a supplier 17 to a space 20.

Figure 9:
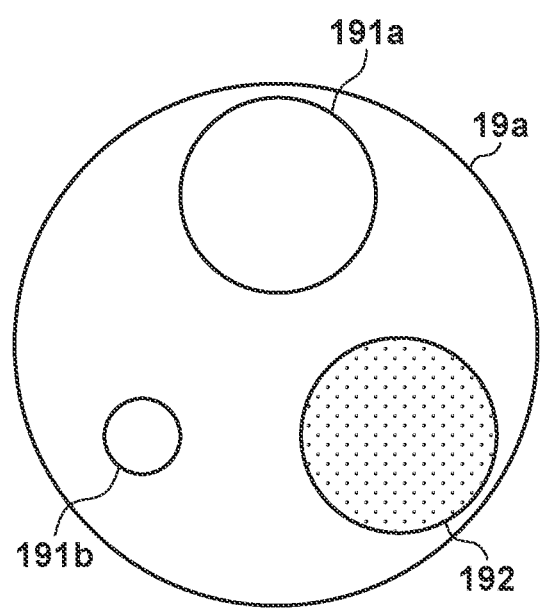
FIG. 9 is a view showing the arrangement of a plate of the adjuster.

For example, the adjuster 19 is configured to use the plate 19a having a plurality of openings 191 different in size and switch the opening 191, out of the plurality of openings 191 in the plate 19a, arranged in the optical path of the energy beam by the driving unit 19b, as shown in FIG. 9. The adjuster 19 thus configured can change the area of the portion arranged in the optical path of the energy beam in accordance with the size of the opening 191 arranged in the optical path. Note that the plate shown in FIG. 9 includes a region 192 where no opening is formed. If this region 192 is arranged in the optical path of the energy beam, a filling acceleration gas is hardly irradiated with the energy beam emitted from the emitting unit 16b of the ion generator 16. This makes it possible to greatly reduce ionization of the filling acceleration gas.

An example will now be described in which the controller 15 controls the adjuster 19. The controller 15 performs steps S10 to S12 of the flowchart shown in FIG. 2 in a state in which a largest first opening 191a out of the plurality of openings 191 in the plate 19a is arranged in the optical path of the energy beam. After step S12 is terminated, the controller 15 controls the driving unit 19b so as to arrange a second opening 191b smaller than the first opening 191a or the region 192 where no opening is formed in the optical path of the energy beam. Then, the controller 15 performs step S13 in a state in which the second opening 191*b* or the region 192 is arranged in the optical path of the energy beam. After step S13 is terminated, the controller 15 then controls the driving unit 19*b* so as to arrange the first opening 191*a* in the optical path of the energy beam, and performs steps S14 to S17 in a state in which the first opening 191*a* is arranged in the optical path of the energy beam. It is possible, by thus controlling the adjuster 19, to make the ion concentration of the filling acceleration gas supplied from the supplier 17 to the space 20 in a contact process lower than that in a process different from the contact process.

Embodiment of Method of Manufacturing Article

A method of manufacturing an article according to an embodiment of the present invention is suitable for manufacturing an article, for example, a microdevice such as a semiconductor device or an element having a microstructure. A pattern of a cured product molded using an imprint apparatus is used permanently for at least some of various articles or used temporarily when the various articles are manufactured. The article includes an electric circuit element, an optical element, a MEMS, a printing element, a sensor, a die, or the like. The electric circuit element includes, for example, a volatile or nonvolatile semiconductor memory such as a DRAM, an SRAM, a flash memory, or an MRAM or a semiconductor element such as an LSI, a CCD, an image sensor, or an FPGA. The die includes an imprinting mold or the like. The pattern of the cured product is used without any change as a constituent member of at least part of the above-described article or used temporarily as a resist mask. The resist mask is removed after etching, ion implantation, or the like is performed in a processing step of the substrate.

The method of manufacturing the article according to this embodiment includes a step of forming a pattern in an imprint material supplied to a substrate using the above-described imprint apparatus (step of performing an imprint process on the substrate) and a step of processing the substrate, on which the pattern has been formed, in the preceding step. This manufacturing method further includes other known steps (oxidation, deposition, vapor deposition, doping, planarization, etching, resist removal, dicing, bonding, packaging, and the like). The method of manufacturing the article according to this embodiment is superior to a conventional method in at least one of the performance, quality, productivity, and production cost of the article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-066315 filed on Mar. 29, 2016, which is hereby incorporated by reference herein in its entirety.

What is claimed is:

1. An imprint apparatus which forms a pattern on an imprint material on a substrate by using a mold, the apparatus comprising:
a generator that generates ionized gas by ionizing a first gas;
a supplier that supplies a second gas including the ionized gas generated by the generator to a space under the mold; and
a controller that controls a flow rate of the second gas supplied by the supplier to the space,
wherein the controller increases the flow rate of the second gas supplied from the supplier to the space so as to reduce a decrease in an ion concentration in the space caused by moving the substrate from the space after the mold is separated from the imprint material.

2. The apparatus according to claim 1, further comprising a detector that detects a pressure of the second gas supplied from the supplier to the space,
wherein the controller increases the flow rate of the second gas supplied from the supplier to the space in response to the detector detecting a decrease in the pressure caused by moving the substrate from the space.

3. The apparatus according to claim 1, wherein the second gas includes a third gas for accelerating filling of a pattern with concave and convex portions formed in the mold with the imprint material.

4. The apparatus according to claim 3, further comprising an adjuster that adjusts the ion concentration of the second gas supplied from the supplier to the space,
wherein the controller controls the adjuster so as to make the ion concentration of the second gas supplied from the supplier to the space in a contact process of bringing the mold and the imprint material into contact with each other lower than that in a process different from the contact process.

5. The apparatus according to claim 4, wherein the second gas further includes a fourth gas without being ionized and the adjuster adjusts the ion concentration of the second gas supplied from the supplier to the space by changing a mixing ratio of the ionized gas in the second gas.

6. The apparatus according to claim 4, wherein the generator generates the ionized gas by irradiating the first gas with an energy beam, and the adjuster includes a plate for blocking the energy beam and adjusts the ion concentration of the ionized gas supplied from the supplier to the space by changing an area of a portion of the plate arranged in an optical path of the energy beam.

7. The apparatus according to claim 6, wherein the plate has a plurality of openings different in size, and the adjuster changes the area by switching an opening, out of the plurality of openings, arranged in the optical path of the energy beam.

8. The apparatus according to claim 1, further comprising a holder that holds the mold, wherein the supplier supplies a gas from a supply port provided in the holder to the space.

9. An imprint apparatus which forms a pattern on an imprint material on a substrate by using a mold, the apparatus comprising:

a generator that generates ionized gas for accelerating filling of a pattern with concave and convex portions formed in the mold with the imprint material;

a supplier that supplies a second gas including the ionized gas generated by the generator to a space under the mold;

an adjuster that adjusts an ion concentration of the second gas supplied from the supplier to the space; and a controller that controls the adjuster so as to make the ion concentration of the second gas supplied from the supplier to the space in a contact process of bringing the mold and the imprint material into contact with each other lower than that in a process different from the contact process.

* * * * *